(12) United States Patent
Bizen et al.

(10) Patent No.: US 11,011,348 B2
(45) Date of Patent: May 18, 2021

(54) SCANNING ELECTRON MICROSCOPE AND SAMPLE OBSERVATION METHOD USING SCANNING ELECTRON MICROSCOPE

(71) Applicant: HITACHI HIGH-TECH CORPORATION, Tokyo (JP)

(72) Inventors: Daisuke Bizen, Tokyo (JP); Natsuki Tsuno, Tokyo (JP); Takafumi Miwa, Tokyo (JP); Makoto Sakakibara, Tokyo (JP); Toshiyuki Yokosuka, Tokyo (JP); Hideyuki Kazumi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 67 days.

(21) Appl. No.: 16/474,499

(22) PCT Filed: Jan. 17, 2017

(86) PCT No.: PCT/JP2017/001355
§ 371 (c)(1),
(2) Date: Jun. 27, 2019

(87) PCT Pub. No.: WO2018/134870
PCT Pub. Date: Jul. 26, 2018

(65) Prior Publication Data
US 2019/0348255 A1 Nov. 14, 2019

(51) Int. Cl.
*H01J 37/244* (2006.01)
*H01J 37/04* (2006.01)
(Continued)

(52) U.S. Cl.
CPC .......... *H01J 37/244* (2013.01); *H01J 37/045* (2013.01); *H01J 37/05* (2013.01); *H01J 37/09* (2013.01);
(Continued)

(58) Field of Classification Search
None
See application file for complete search history.

(56) References Cited

U.S. PATENT DOCUMENTS 8,653,455 B2 * 2/2014 Kitsunai ............... H01J 37/145
250/306
2011/0147586 A1 * 6/2011 Fukuda ................. H01J 37/265
250/310
(Continued)

FOREIGN PATENT DOCUMENTS

JP 2005292157 10/2005
JP 2008262882 10/2008

OTHER PUBLICATIONS

International Search Report for PCT/2017/001355, dated Apr. 18, 2017.

*Primary Examiner* — Andrew Smyth
(74) *Attorney, Agent, or Firm* — Miles & Stockbridge, P.C.

(57) ABSTRACT

Provided is a scanning electron microscope. The scanning electron microscope is capable of removing a charge generated on a side wall of a deep hole or groove, and inspects and measures a bottom portion of the deep hole or groove with high accuracy. Therefore, in the scanning electron microscope that includes an electron source 201 that emits a primary electron, a sample stage 213 on which a sample is placed, a deflector 207 that causes the sample to be scanned with the primary electron, an objective lens 203 that focuses the primary electron on the sample, and a detector 206 that detects a secondary electron generated by irradiating the sample with the primary electron, a potential applied to the sample stage is controlled to have a negative polarity with respect to a potential applied to the objective lens during a first period in which the sample is irradiated with the primary electron, and the potential applied to the sample (Continued)

stage is controlled to have a positive polarity with respect to the potential applied to the objective lens during a second period in which the sample is not irradiated with the primary electron.

12 Claims, 12 Drawing Sheets

(51) Int. Cl.
*H01J 37/05* (2006.01)
*H01J 37/09* (2006.01)
*H01J 37/10* (2006.01)
*H01J 37/20* (2006.01)
*H01J 37/28* (2006.01)

(52) U.S. Cl.
CPC .............. *H01J 37/10* (2013.01); *H01J 37/20* (2013.01); *H01J 37/28* (2013.01); *H01J 2237/2448* (2013.01)

(56) References Cited

U.S. PATENT DOCUMENTS

2015/0303030 A1* 10/2015 Kimura .................. H01J 37/28
250/307
2017/0345614 A1* 11/2017 Kimura .................. H01J 37/06

\* cited by examiner

[FIG. 1]
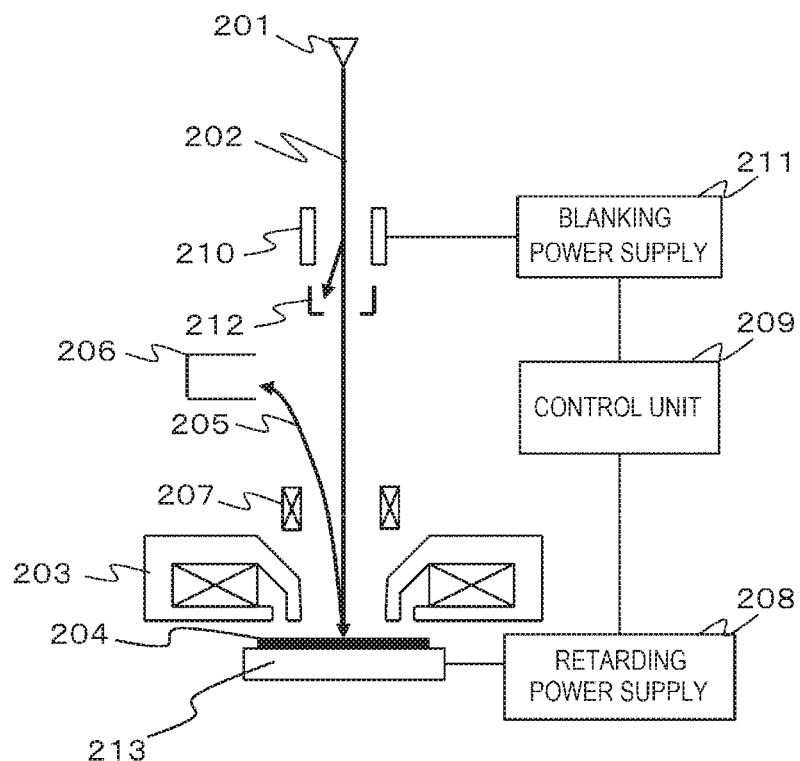
[FIG. 2]
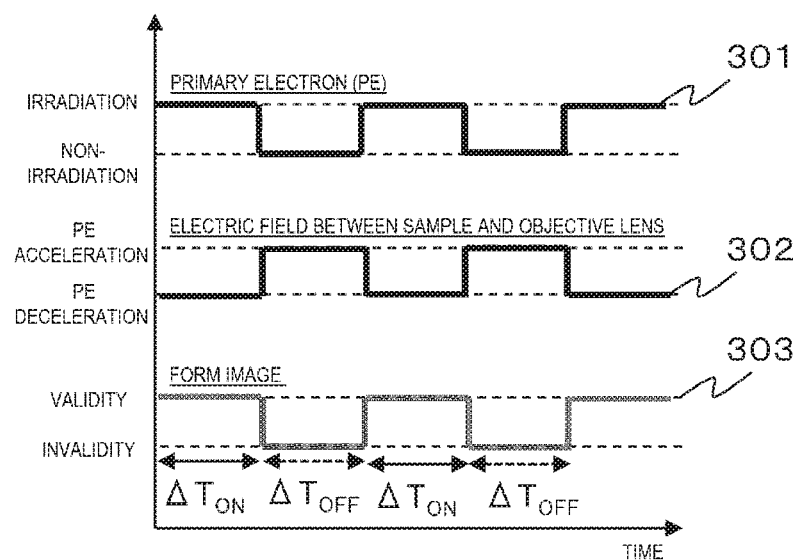

[FIG. 3]
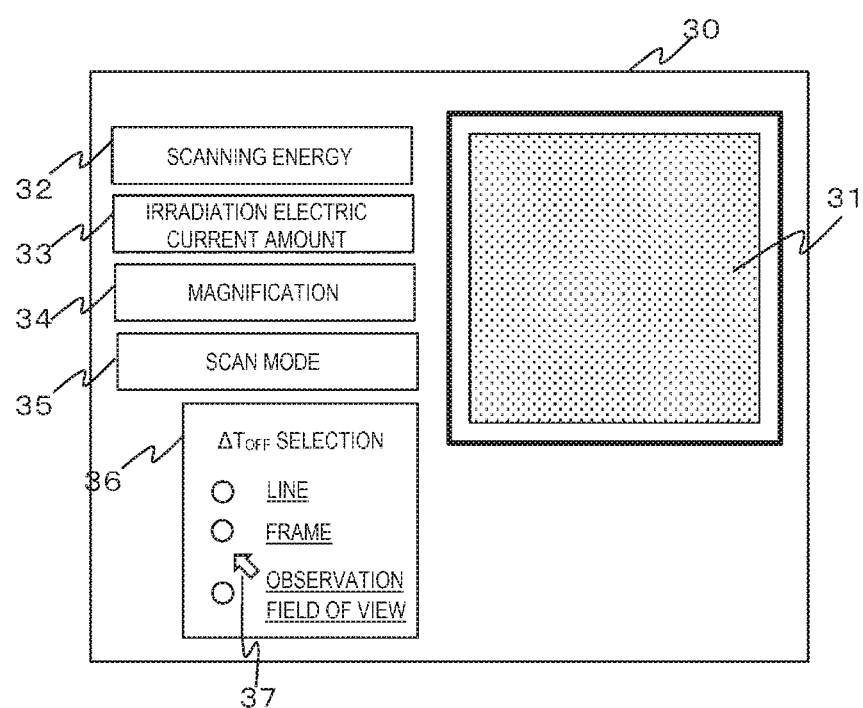

[FIG. 4]
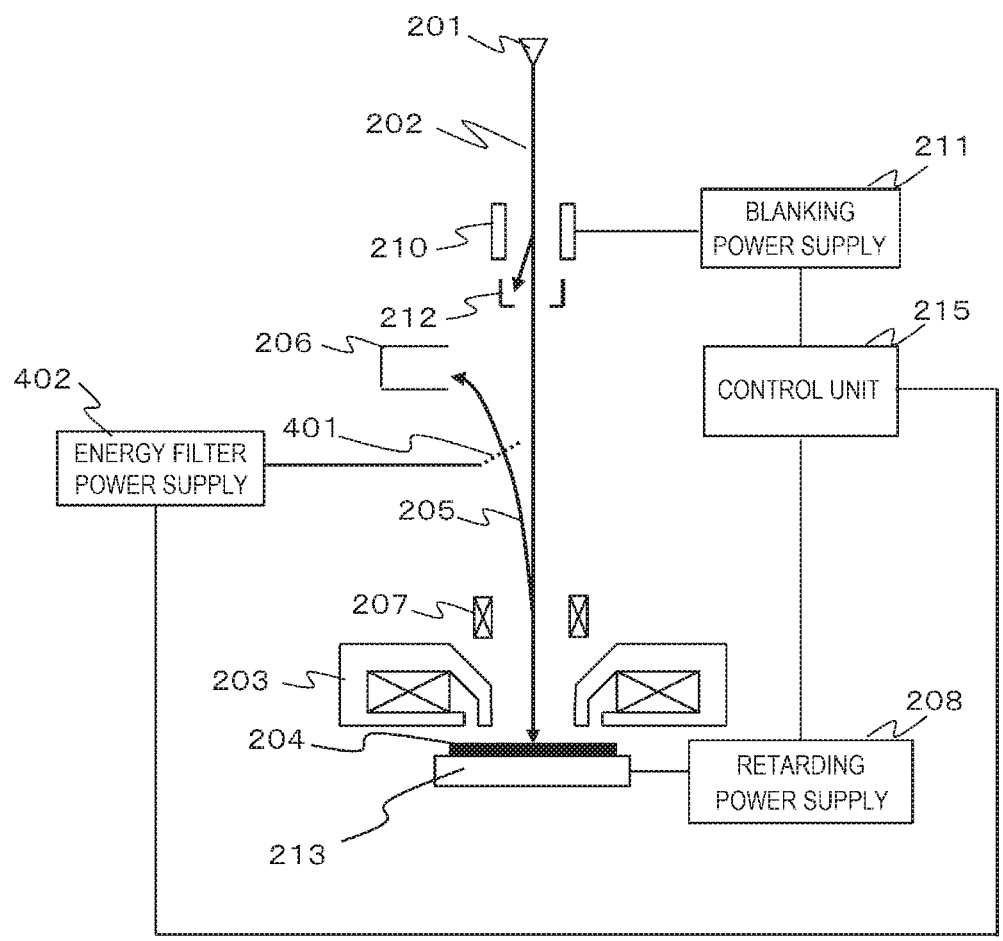

[FIG. 5]
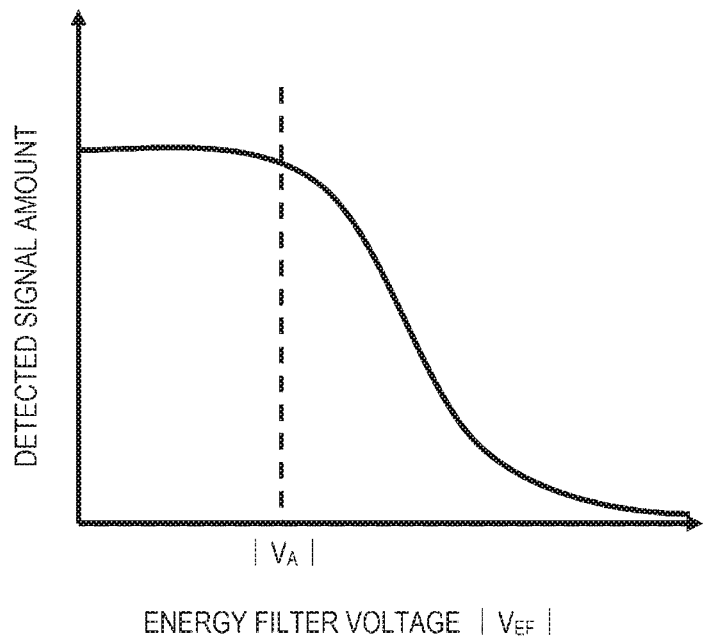
[FIG. 6A]
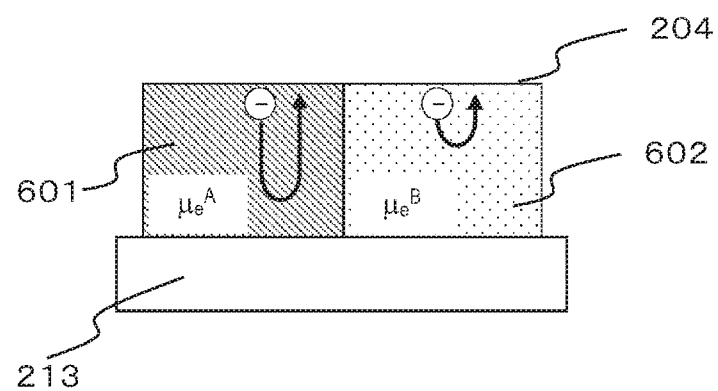

[FIG. 6B]
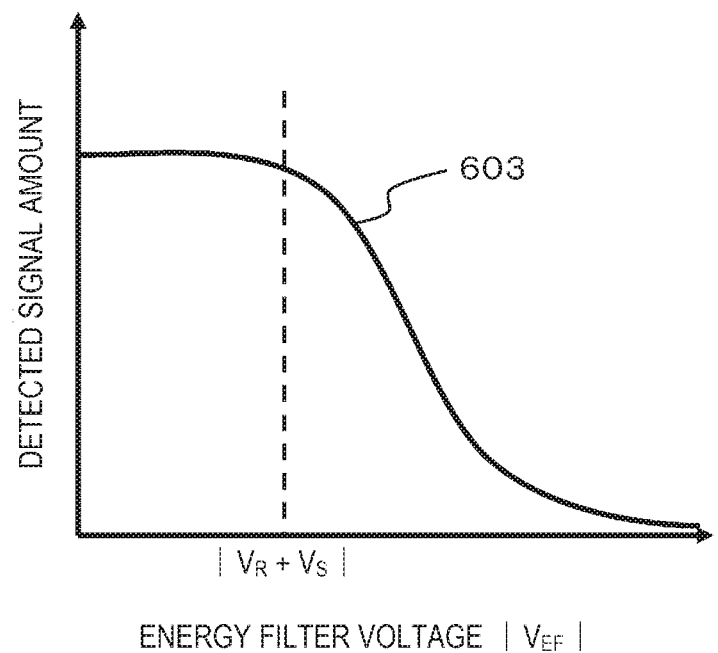
[FIG. 6C]
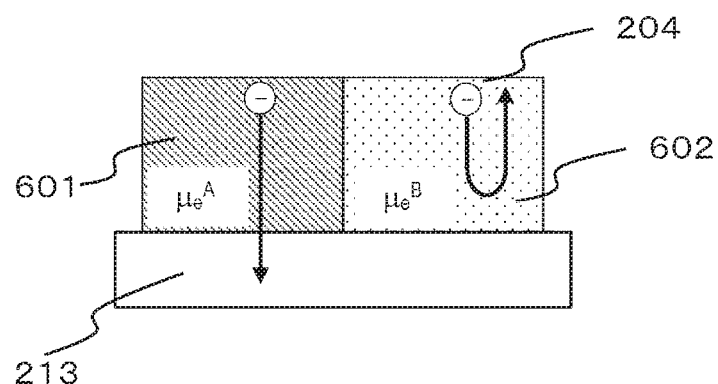

[FIG. 6D]
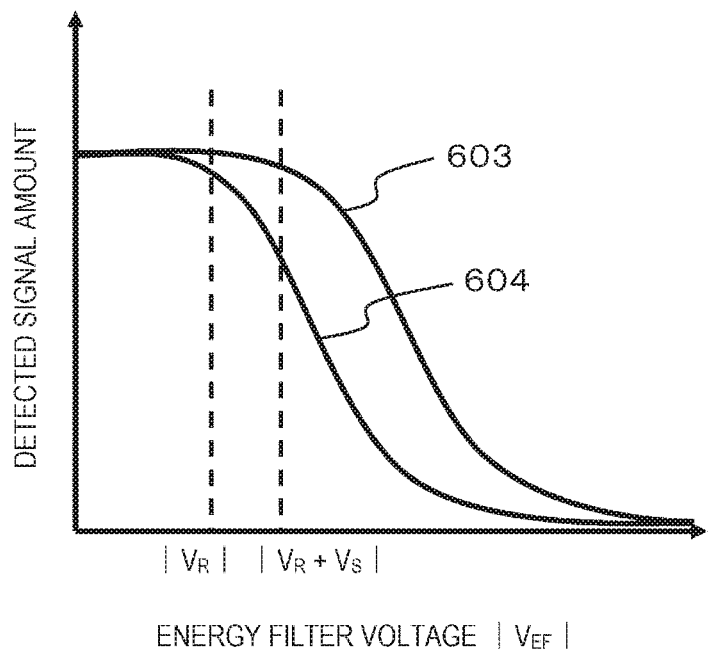
[FIG. 7A]
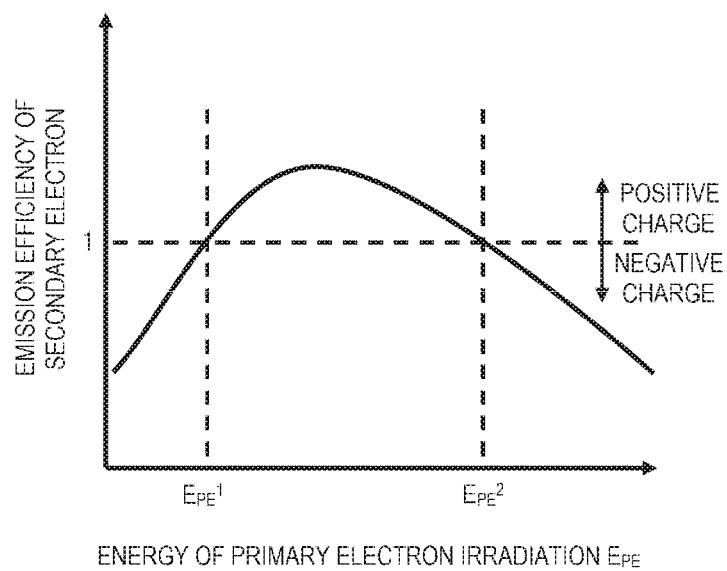

[FIG. 7B]
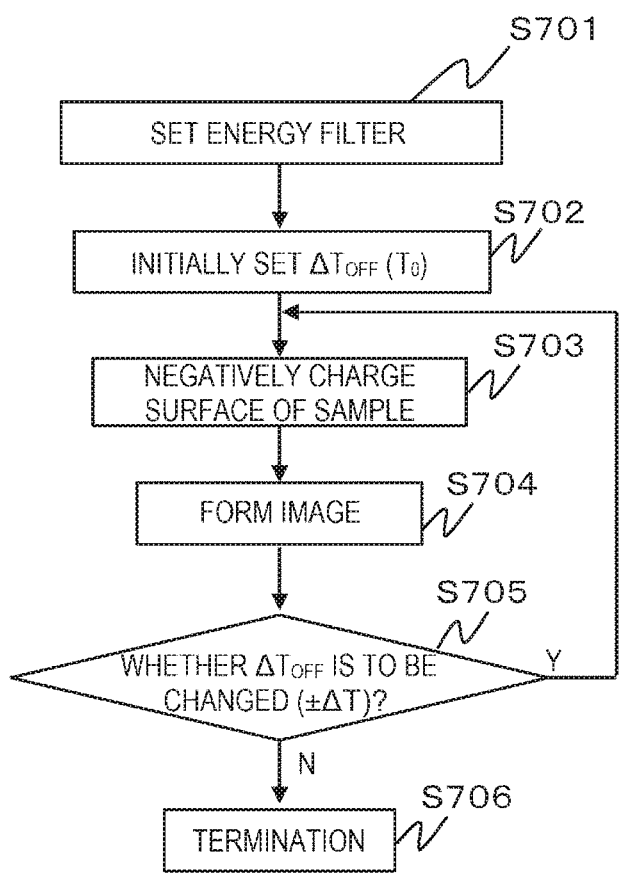

[FIG. 8]
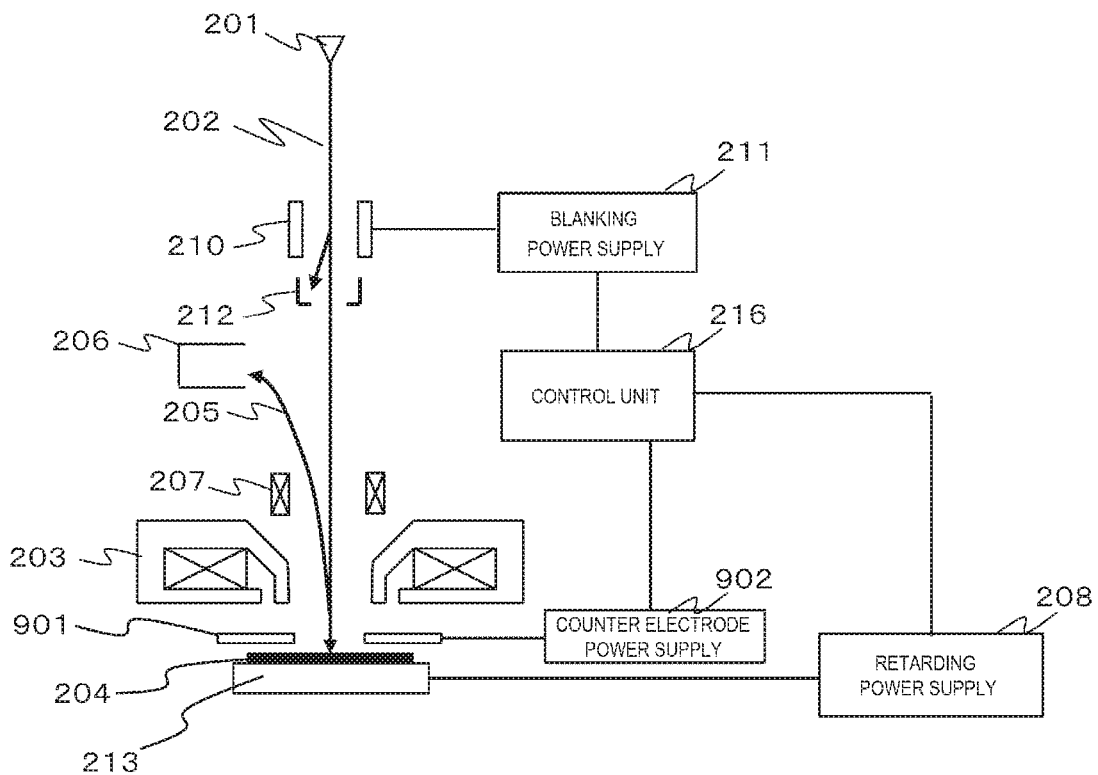
[FIG. 9A]
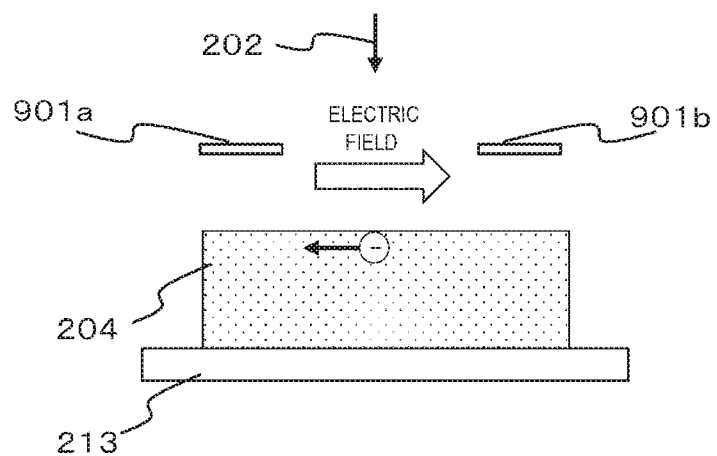

[FIG. 9B]
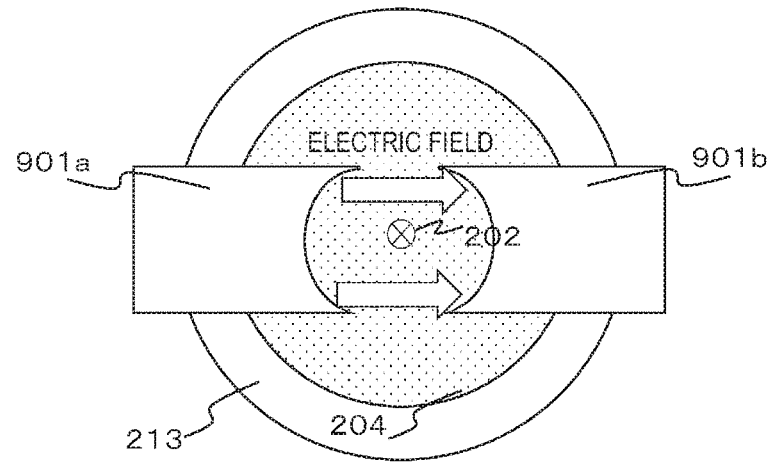
[FIG. 10]
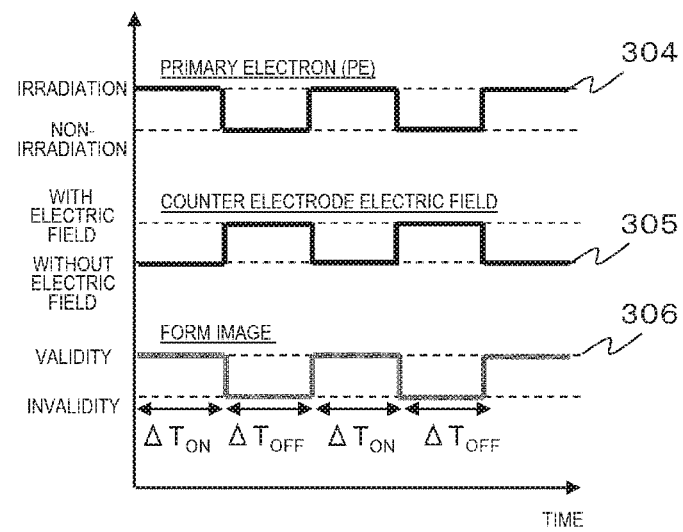

[FIG. 11A]
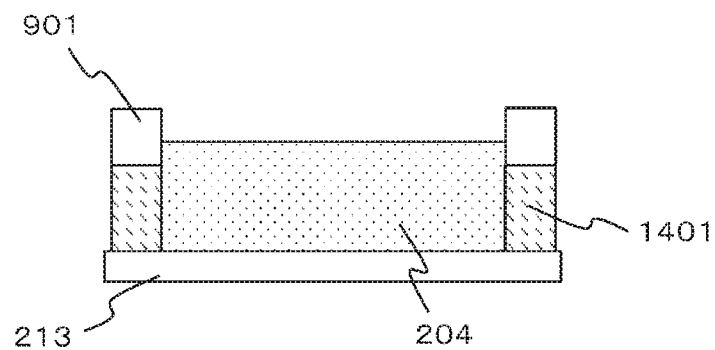
[FIG. 11B]
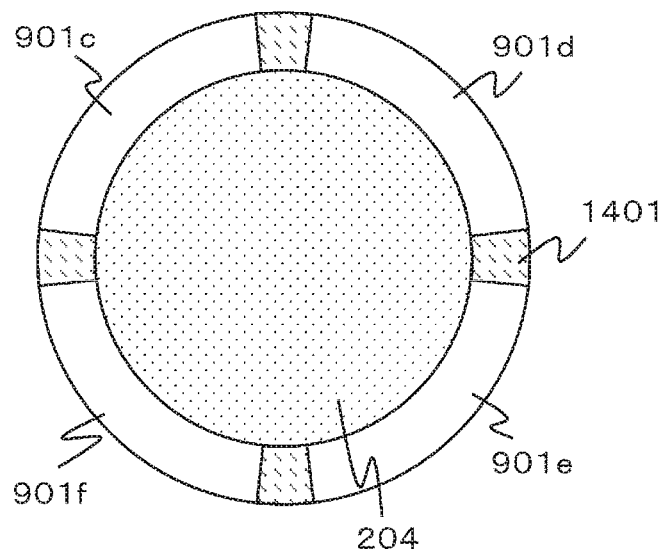

[FIG. 12]
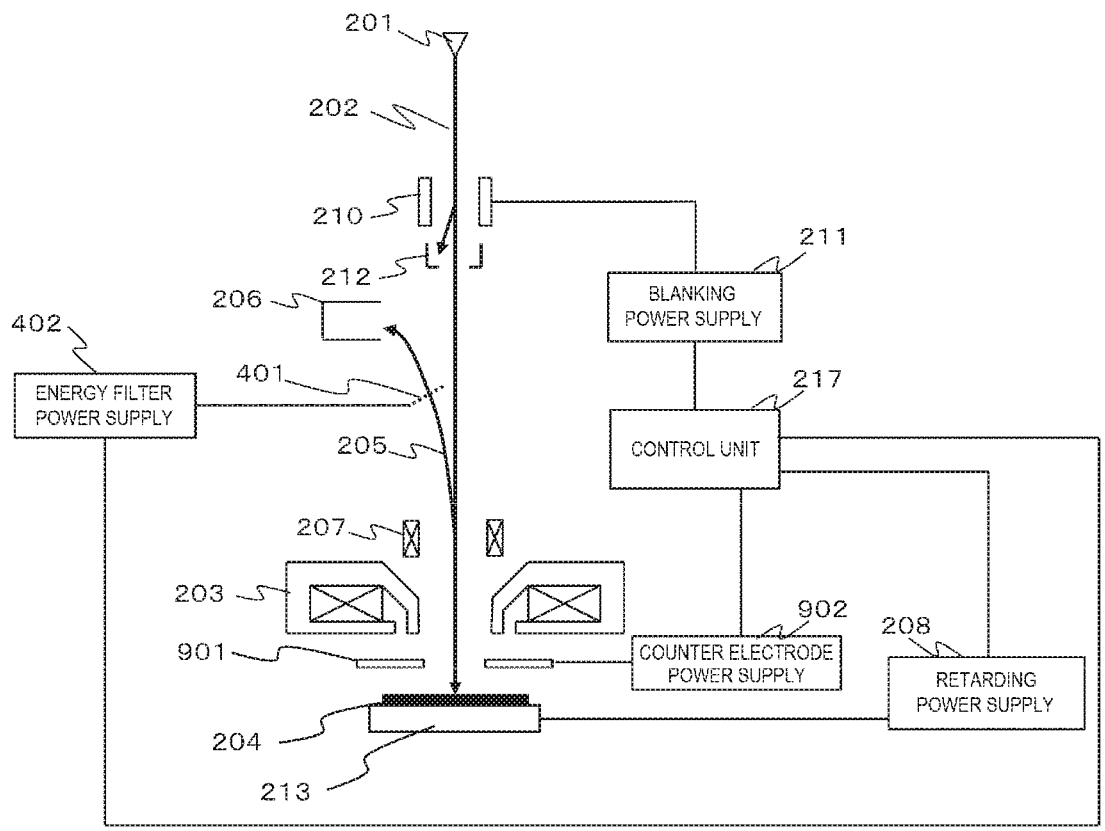
[FIG. 13]
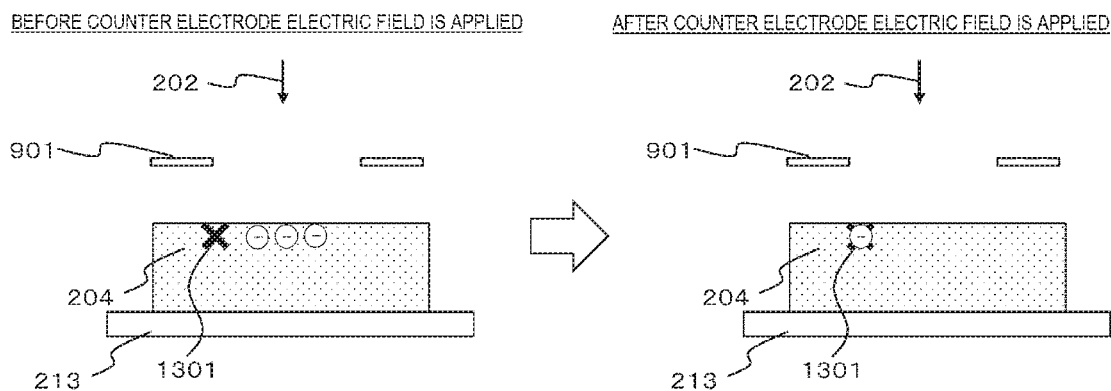

[FIG. 14A]
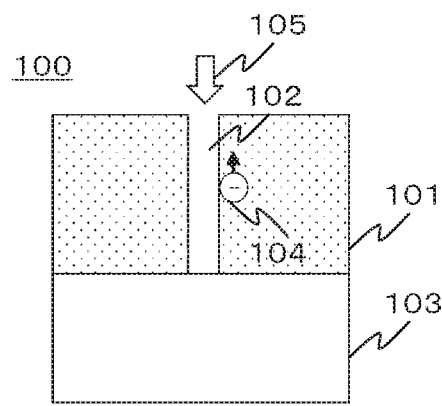
[FIG. 14B]
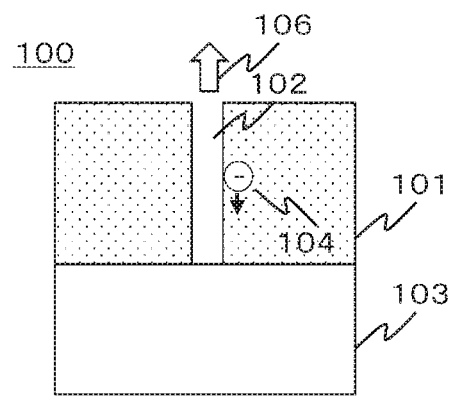

SCANNING ELECTRON MICROSCOPE AND SAMPLE OBSERVATION METHOD USING SCANNING ELECTRON MICROSCOPE

TECHNICAL FIELD

The present invention relates to a scanning electron microscope that extracts primary electron beams from an electron source, and detects secondary electrons obtained by scanning a sample with the primary electron beams to obtain a microscope image of the sample.

BACKGROUND ART

When a sample is scanned with primary electrons, a scanning electron microscope detects secondary electrons generated by primary electron beams interacting with the sample, and outputs a microscope image based on an amount of the detected secondary electrons. In particular, a structure can be visualized with nanometer resolution without destroying the sample. Thus, the scanning electron microscope has been widely used for inspection and measurement of a semiconductor device that enhances integration by miniaturization of a structure. Here, the secondary electrons include not only (true) secondary electrons having an energy of 50 [eV] or less, but also backscattered electrons that are detected by a detector of the scanning electron microscope and have an energy of 50 [eV] or more, which are secondary electrons in a broad sense, so to speak.

In recent years, high integration of the semiconductor device has been achieved not only by miniaturization but also by three-dimensional formation of a structure. Therefore, the semiconductor device may have a complicated laminated structure. It is necessary for the scanning electron microscope, which performs such inspection and measurement of a sample, to clearly visualize not only an outermost surface of a laminated film but also a bottom portion of a very deep hole or a very deep groove (hereinafter, referred to as a "deep hole or groove") formed in the laminated film. In addition, the laminated film has a structure including an insulator in many cases. Thus, it is necessary to inspect and measure the bottom portion of the deep hole or groove while preventing an effect of a charge.

Meanwhile, as a technique for removing a charge of a sample (insulator), examples are as follows. PTL 1 discloses a method of performing primary electron scanning for removing a charge, which is different from primary electron beam scanning for acquiring an image by using a primary electron irradiation energy, during swing back deflection. Specifically, in the primary electron scanning for removing the charge, an irradiation energy of the primary electrons is set as an irradiation energy that causes a positive charge to be formed, whereby a negative charge generated on a sample surface is removed.

As another method, there is a method by light irradiation as disclosed in PTL 2. Irradiation is performed with light beams having an energy larger than that of a work function of an insulator, so that a fact that photoelectrons are emitted from a sample, and the sample can be positively charged is used.

PRIOR ART LITERATURE

Patent Literature

PTL 1: JP-A-2008-262882
PTL 2: JP-A-2005-292157

SUMMARY OF INVENTION

Technical Problem

Most of the secondary electrons generated at the bottom portion of the deep hole or groove are absorbed by a side wall, thus forming a negative charge on the side wall. An electric field caused by the negative charge of the sidewall acts to return the secondary electrons generated at the bottom portion to the bottom portion, and causes a problem of deflecting the primary electrons that have entered the deep hole or groove. Therefore, in order to inspect and measure the bottom portion of the deep hole or groove with high accuracy, it is necessary to remove the charge generated at the side wall.

Meanwhile, the technique for removing the charge as described in the related art aims to remove the charge on the surface of the sample, and an effect of removing the charge generated at the side wall is low. For example, even if a side wall of the deep hole or groove is irradiated with the primary electrons having an irradiation energy capable of forming the positive charge on the surface of the sample, most of the generated secondary electrons are absorbed in the deep hole or groove, and most of the electrons cannot escape from the side wall. Thus, the negative charge on the side wall cannot be removed. Even when the deep hole or groove is irradiated with light, the photoelectrons emitted from the side wall by the light irradiation again collide with the side wall. Thus, the negative charge on the side wall cannot be removed.

An object of the invention is to provide a scanning electron microscope that is capable of removing a charge generated at a side wall of a deep hole or groove, and that inspects and measures a bottom portion of the deep hole or groove with high accuracy.

Solution to Problem

Representative means for solving the above problems are as follows.

Provided is a scanning electron microscope. The scanning electron microscope includes an electron source that emits a primary electron; a sample stage on which a sample is placed; a deflector that causes the sample to be scanned with the primary electron; an objective lens that focuses the primary electron on the sample; a primary electron control mechanism that controls irradiation of the sample with the primary electron; an electric field control mechanism that controls an electric field between the objective lens and the sample stage; a detector that detects a secondary electron generated by irradiating the sample with the primary electron; and a control unit that, during a first period in which the sample placed on the sample stage is irradiated with the primary electron emitted from the electron source by the primary electron control mechanism, controls such that the electric field control mechanism makes a potential applied to the sample stage have a negative polarity with respect to a potential applied to the objective lens, and during a second period in which the sample placed on the sample stage is not irradiated with the primary electron emitted from the electron source by the primary electron control mechanism, controls such that the electric field control mechanism makes the potential applied to the sample stage have a positive polarity with respect to the potential applied to the objective lens.

Advantageous Effect

A negative charge accumulated on a side wall of a deep hole or groove can be removed.

BRIEF DESCRIPTION OF DRAWINGS

FIG. 1 is a view illustrating a configuration of a scanning electron microscope according to a first embodiment.

FIG. 2 is a diagram showing a control by a control unit in the first embodiment.

FIG. 3 is a view illustrating an example of an operation screen in the first embodiment.

FIG. 4 is a view illustrating a configuration of a scanning electron microscope according to a second embodiment.

FIG. 5 is a diagram showing a detected signal amount of an energy filter.

FIG. 6A is a view illustrating movement of an electron in a case where $\Delta T_{OFF}$ is sufficiently short.

FIG. 6B is a diagram showing a detected signal amount of the energy filter in a case where $\Delta T_{OFF}$ is sufficiently short.

FIG. 6C is a view illustrating movement of the electron in a case where $\Delta T_{OFF}$ is set to be long.

FIG. 6D is a diagram showing a detected signal amount of the energy filter in a case where $\Delta T_{OFF}$ is set to be long.

FIG. 7A is a diagram showing emission efficiency of a secondary electron.

FIG. 7B is a flowchart showing a sample observation method according to the second embodiment.

FIG. 8 is a view illustrating a configuration of a scanning electron microscope according to a third embodiment.

FIG. 9A is a view (sectional view) illustrating a charge removing method by a counter electrode.

FIG. 9B is a view (top view) illustrating the charge removing method by the counter electrode.

FIG. 10 is a diagram showing a control by a control unit in the third embodiment.

FIG. 11A is a view (sectional view) illustrating a configuration example in which the counter electrode is disposed on a sample stage.

FIG. 11B is a view (top view) illustrating the configuration example in which the counter electrode is disposed on the sample stage.

FIG. 12 is a view illustrating a configuration of a scanning electron microscope according to a fourth embodiment.

FIG. 13 is a view illustrating a principle of visualizing a defect on a surface of an insulator.

FIG. 14A is a view illustrating a principle of the invention.

FIG. 14B is a view illustrating a principle of the invention.

DESCRIPTION OF EMBODIMENTS

In a scanning electron microscope that inspects and measures a semiconductor device, it is necessary to lower an irradiation energy of a primary electron beam in order to avoid damage to the device. Therefore, in order to focus a primary electron with a low irradiation energy and high resolution of the primary electron being achieved, a retarding optical system is used which decelerates the primary electron near a sample to be observed and irradiates the sample with the decelerated primary electron. Principles of the invention are described with reference to FIGS. 14A to 14B. In a sample 100, an insulator 101 is laminated on a semiconductor substrate 103 such as Si. A deep hole or groove 102 is formed in the insulator 101. An electric field 105 is applied to the sample 100 in a direction where the primary electron is decelerated in the retarding optical system. An electron 104, which is accumulated on a side wall of the deep hole or groove 102, is accumulated near a surface of the side wall of the deep hole or groove, and is subjected to a force in a direction away from the substrate 103 that is in contact with a sample stage or the like by the electric field 105 (FIG. 14A). Therefore, even after a lapse of time, the electron accumulated on the side wall is not removed.

On the contrast, as shown in FIG. 14B in the invention, when irradiation is not performed with the primary electron, an electric field 106 in a direction of accelerating the primary electron is applied to the sample 100, thereby applying a force that moves the electron accumulated on the side wall in a direction of the substrate 103. Accordingly, the electron accumulated on the side wall travels near a surface of the side wall of the deep hole or groove and moves to the substrate 103, so that a charge can be removed.

Hereinafter, embodiments of the invention are described in detail with reference to the drawings.

Embodiment 1

FIG. 1 is a view illustrating a configuration of a scanning electron microscope according to the first embodiment. A sample 204 is irradiated with a primary electron 202 that is extracted from an electron source 201 and that is focused by an objective lens 203. A secondary electron 205, which is generated due to the irradiation of the sample 204 with the primary electron 202, is detected by a detector 206. The sample 204 is scanned with the primary electron 202 by a deflector 207, and the secondary electron 205 emitted from each point of the sample 204 is detected by the detector 206, thereby obtaining a scanned image.

The sample 204 is placed on a sample stage 213, and a voltage can be applied to the sample stage 213 by a retarding power supply 208. The retarding power supply 208 can output a voltage of both polarities. The voltage output by the retarding power supply 208 and a timing thereof are controlled by a control unit 209.

A blanking electrode 210 controls irradiation or non-irradiation of the sample 204 with the primary electron 202. A voltage can be applied to the blanking electrode 210 by a blanking power supply 211, and when the voltage is applied, the primary electron 202 is deflected and collides with a diaphragm 212. Thus, the sample 204 is not irradiated with the primary electron 202. A voltage output from the blanking power supply 211 to the blanking electrode 210 and a timing thereof are controlled by the control unit 209, the same as that of the retarding power supply 208.

When a negative polarity voltage is applied to the sample stage 213 from the retarding power supply 208, the objective lens 203 directly above the sample 204 is at a ground potential (reference potential). Thus, an electric field that decelerates the primary electron 202 is generated between the objective lens 203 and the sample 204. Meanwhile, when a positive polarity voltage is applied to the sample 204 from the retarding power supply 208, an electric field that accelerates the primary electron 202 is generated between the objective lens 203 and the sample 204. In the embodiment, as shown in FIG. 2, the control unit 209 controls the retarding power supply 208 and the blanking power supply 211. A horizontal axis in FIG. 2 indicates time. A waveform 301 indicates that irradiation or non-irradiation with the primary electron is controlled by the blanking power supply 211; a waveform 302 indicates that the electric field between the sample and the objective lens is controlled by the retarding power supply 208; and a waveform 303 indicates validity or invalidity of forming an image during a corresponding period. During a period $\Delta T_{ON}$, while the blanking power supply 211 is controlled such that the sample 204 is irradiated with the primary electron 202, the negative polarity voltage is applied to the sample 204 by the retarding power supply 208, whereby the electric field that decelerates the primary electron 202 is generated between the objective lens 203 and the sample 204. During a period $\Delta T_{OFF}$, while the blanking power supply 211 is controlled such that the sample 204 is not irradiated with the primary electron 202, the positive polarity voltage is applied to the sample 204 by the retarding power supply 208, whereby the electric field that accelerates the primary electron 202 is generated between the objective lens 203 and the sample 204. Accordingly, the electron accumulated on the insulator, particularly on a side wall of a deep hole or groove, moves in a direction of a substrate, and a negative charge can be removed. During the period $\Delta T_{ON}$, an output value of the detector 206, which is obtained when the sample 204 is irradiated with the primary electron 202, is used to form the image, whereby a scanned image from which the negative charge is removed can be acquired.

A timing of applying the positive polarity voltage to the sample 204 is not limited. The image is formed by scanning an image acquisition region (observation field of view) of the sample 204 with an electron beam. One scanning performed on an entire observation area is referred to as a frame. Usually such scanning is repeated a plurality of times, and a plurality of frames are integrated, thus forming an image of the observation field of view. A timing of applying the positive polarity voltage to the sample 204 includes, for example, a period of shifting from scanning of one line to scanning of a next line, or a period between acquiring one frame and starting scanning of a next frame, or a period between forming an image of the observation field of view and moving to a next observation field of view.

FIG. 3 illustrates an operation screen in a case where observation is performed based on the control in FIG. 2. The scanning electron microscope in FIG. 1 operates under control of an operator from a control apparatus (not shown). The control apparatus includes a display apparatus (display) that displays the operation screen or the like which inputs an image or control contents acquired from the scanning electron microscope to the operator, and an input apparatus such as a keyboard or a pointing device that inputs instruction contents. In addition to an acquired image 31 from the scanning electron microscope, an operation screen 30 includes a display input field that displays and inputs an optical condition, an image forming condition or the like for forming an image. For example, a scanning energy display field 32, an irradiation electric current amount display field 33, a magnification display field 34, a scan mode display field 35, or the like are displayed. In a case where a voltage control mode as shown in FIG. 2 is selected as a scan mode, a $\Delta T_{OFF}$ selection field 36 is displayed. Options of "line", "frame", and "observation field of view" are provided in the $\Delta T_{OFF}$ selection field 36, and the operator selects either one of the options with a pointer 37, whereby the timing of applying the positive polarity voltage to the sample 204 can be selected.

As an electric field control mechanism that controls an electric field between the objective lens and the sample stage in the example in FIG. 1, the retarding power supply 208 is controlled to control an electric field between the sample 204 and the objective lens 203, but the control method is not limited thereto. For example, the sample stage 213 is set at a ground potential, the positive polarity voltage is applied to the objective lens 203 during the period $\Delta T_{ON}$, and the negative polarity voltage is applied to the objective lens 203 during the period $\Delta T_{OFF}$, whereby the electric field between the sample 204 and the objective lens 203 may be controlled. Alternatively, the positive polarity voltage may be applied to the objective lens 203, and the negative polarity voltage may be applied to the sample stage 213 during the period $\Delta T_{ON}$; and the negative polarity voltage may be applied to the objective lens 203, and the positive polarity voltage may be applied to the sample stage 213 during the period $\Delta T_{OFF}$. That is, as long as an electric field that decelerates the primary electron is generated between the sample and the objective lens during the period $\Delta T_{ON}$, and an electric field that accelerates the primary electron is generated between the sample and the objective lens during the period $\Delta T_{OFF}$, that is, in a direction opposite to that of the period $\Delta T_{ON}$, various control methods can be adopted.

As a primary electron control mechanism that controls the irradiation or non-irradiation of the sample 204 with the primary electron 202, a portion other than the blanking electrode 210 can be adopted. For example, a plate that blocks an optical axis of the primary electron 202 may be placed in and out of the optical axis, whereby the irradiation or non-irradiation of the sample 204 with the primary electron 202 may be controlled. Alternatively, light irradiation of a photocathode is controlled by using the photocathode that emits the primary electron 202 by light irradiation and that serves as the electron source 201, whereby the irradiation or non-irradiation of the sample 204 with the primary electron 202 can be controlled.

The electric field between the sample 204 and the objective lens 203 has an effect of 0.1 kV/mm to 10 kV/mm in a case where the primary electron 202 is accelerated or decelerated. It is assumed that the period $\Delta T_{ON}$ in which the sample 204 is irradiated with the primary electron 202 and the period $\Delta T_{OFF}$ in which the sample 204 is not irradiated with the primary electron 202 can be controlled in a range from 1µ second to 1000 seconds by the control unit 209.

In addition to directly detecting the secondary electron 205 generated on the sample 204 by the detector 206, for example, the secondary electron 205 may collide with a conversion plate (not shown), and a tertiary electron may be detected which is generated by the collision of the secondary electron 205 with the conversion plate.

Embodiment 2

In the second embodiment, a scanning electron microscope that visualizes a difference in electron mobility of the sample 204 is described in detail.

FIG. 4 illustrates a configuration of a scanning electron microscope according to the second embodiment. The same components as those of the scanning electron microscope illustrated in FIG. 1 are denoted by the same reference numerals, and a description thereof is omitted. The scanning electron microscope according to the second embodiment includes an energy filter 401 that selects an energy of the secondary electron 205 and an energy filter power supply 402 for applying a voltage to the energy filter 401. The energy filter 401 is disposed between the detector 206 and the objective lens 203. As a specific configuration example of the energy filter 401, a deceleration electric field energy filter, which includes a grid of conductors to which a voltage $V_{EF}$ ($V_{EF}<0$ V (reference potential)) is applied and only causes the secondary electron 205 having an energy of $-eV_{EF}$ [eV] or more to pass, can be used. Here, "e" is an elementary electric charge. In addition to the blanking power supply 211 and the retarding power supply 208, a control unit 215 controls magnitude of the voltage $V_{EF}$ generated by the energy filter power supply 402 and a timing at which the voltage $V_{EF}$ is generated.

In a case where the objective lens 203 is set at a ground potential (reference potential) and a voltage $V_R$ ($V_R<0$ V) is applied to the sample stage 213 by the retarding power supply 208, the secondary electron 205 emitted from the sample 204 is accelerated by an electric field generated by the voltage $V_R$, whereby the secondary electron 205 is incident on the energy filter 401 with an energy of $-eV_3$ [eV] or more. FIG. 5 shows a signal amount detected by the detector 206 in a case where a voltage $V_{EF}$ applied from the energy filter power supply 402 to the energy filter 401 is swept. In a case where an absolute value of the voltage $V_{EF}$ (hereinafter, referred to as a voltage $|V_{EF}|$; the same applies to other voltages) is less than a voltage $|V_A|$, the signal amount detected by detector 206 is saturated, and the detected signal amount is substantially constant regardless of magnitude of the voltage $|V_A|$. When the voltage $|V_{EF}|$ exceeds the voltage $|V_A|$, the signal amount detected by detector 206 begins to decrease.

In a case where the sample 204 is not charged, when a voltage $V_A$=a retarding voltage $V_R$, and a voltage greater than a voltage $|V_3|$ is applied as the voltage $|V_{EF}|$ applied to the energy filter 401, the signal amount begins to decrease. Meanwhile, in a case where a sample surface is charged by a voltage $V_s$ ($V_s<0$ V), when the voltage $V_A$=retarding voltage $V_3$+charging voltage $V_S$, and a voltage greater than a voltage $|V_R+V_S|$ is applied as the voltage $|V_{EF}|$ applied to the energy filter 401, the signal amount begins to decrease. That is, with regard to the voltage $V_{EF}$ applied to the energy filter 401, a charging state of the sample 204 is reflected in a value of the voltage $V_A$ at which the signal amount detected by the detector 206 begins to decrease.

By using the above, a surface potential of the sample 204 is measured by the energy filter 401 using the period $\Delta T_{OFF}$ during which the sample 204 is not irradiated with the primary electron 202 as a variable, whereby a difference in electron mobility $\mu_e$ contained in the sample 204 can be visualized.

A case where the sample 204 includes a material A and a material B that have different electron mobility $\mu_e$ is described as an example. Both the materials A, B are insulator materials. Electron mobility of the material A is $\mu_e^A$, electron mobility of the material B is $\mu_e^B$, and $\mu_e^A>\mu_B$ is satisfied. In a case where a surface of the sample 204 is negatively charged, the sequence shown in FIG. 2 is performed. The surface potentials of the material A and the material B caused by a negative charge are $V_R+V_S$ (retarding voltage $V_R<0$, $V_S$ caused by charging voltage<0).

First, a case where the period $\Delta T_{OFF}$ is sufficiently short is described with reference to FIGS. 6A and 6B. In this case, as illustrated in FIG. 6A, time for applying a voltage, which has a positive polarity with respect to a potential of the objective lens, to the sample stage 213 is short. Thus, a charged electron in a material A601 and a charged electron in a material B602 do not reach the sample stage 213. In this case, since surface potentials of the material A601 and the material B602 are $V_R+V_S$ same as that of the initial state also during the subsequent period $\Delta T_{ON}$, a shift is not found in energy filter voltage dependence of the detected signal amount obtained with the material A601 and the material B602 (FIG. 6B). Therefore, no matter how the energy filter voltage $V_{EF}$ is set to acquire a scanned image, there is no contrast between the material A601 and the material B602.

On the contrast, a case where the period $\Delta T_{OFF}$ is extended is described with reference to FIGS. 6C and 6D. As illustrated in FIG. 6C, it is assumed that time of the period $\Delta T_{OFF}$ is selected such that an electron, which is charged in the material A601 having the high electron mobility, reaches the sample stage 213, and an electron, which is charged in the material B602 having the low electron mobility, does not reach the sample stage 213. In this case, energy filter voltage dependence of the detected signal amount during the subsequent period $\Delta T_{ON}$ is shown in FIG. 6D. During the period $\Delta T_{OFF}$, charge of the material A601 is removed, and as shown in a waveform 604, the energy filter voltage dependence of the detected signal amount is that when a voltage becomes larger than a voltage $|V_R|$, a signal amount begins to decrease. Meanwhile, charge of the material B602 is not removed. Thus, as shown in a waveform 603, the energy filter voltage dependence of the detected signal amount is that the signal amount begins to decrease from a voltage $|V_3+V_S|$. Therefore, the energy filter voltage dependence of the detected signal amount is shifted for the material A601 and the material B602. Therefore, for example, when the scanned image is acquired in a state where the energy filter voltage $V_{EF}$ is set to $V_R+V_S$, a clearer contrast is obtained for the material B602 than for the material A601.

The method of visualizing the difference in the electron mobility caused by the difference of the materials in the sample 204 by adjusting the period $\Delta T_{OFF}$ has been described above. Of course, even if three or more kinds of materials are included, visualization can be achieved. Not only can the difference of the materials but also a characteristic of a material that affects easiness of electron transfer in a substance be visualized. For example, a difference in electron capture amount caused by a difference in defect density even with a same material can be visualized.

When observation of the present embodiment is performed, it is necessary to set the sample 204 in a negative charge state as an initial charge state. The negative charge state can be implemented by appropriately selecting an energy during irradiation of the sample with the primary electron 202. As shown in FIG. 7A, emission efficiency of the secondary electron 205 in an insulator changes depending on an energy $E_{PE}$ during the irradiation of the sample with the primary electron 202. In a case where the energy $E_{PE}$ is $E_{PE}^1$ or less, or $E_{PE}^2$ or more, the emission efficiency of the secondary electron 205 is 1 or less, that is, a negative charge is formed. As a typical value, $E_{pe}^1$ is 50 [eV] and $E_{PE}^2$ is about 3 k [eV].

A sample observation method in the present embodiment is shown in FIG. 7B. First, an optical condition and an image forming condition for forming an image as described in the first embodiment are set (including a setting for how to provide the period $\Delta T_{OFF}$), but particularly as a setting unique to the present embodiment, an energy of a secondary electron to be selected by an energy filter is set (S701). For example, an energy filter voltage $V_{EF}$ may be set to $|V_{EF}|>|V_R|$. $\Delta T_{OFF}$ is set to $T_0$ time as an initial setting (S702). Thus, setting of an observation condition is completed. Then, a sample surface is negatively charged (S703). As described above, this can be performed by irradiating the sample with a primary electron under a condition that the emission efficiency of the secondary electron is 1 or less. The image is formed for the negatively charged sample under the set condition (S704). In a case where an observation is continued by changing $\Delta T_{OFF}$ (S705), the sample surface is negatively charged again so as to continue the observation.

The energy filter 401 is not limited to the deceleration electric field type. A same effect can also be attained even with a deflection type in which energy selection of the secondary electron 205 is performed in a deflection field by using an electromagnetic field. In this case, control of an energy of a secondary electron selected by an energy filter has a control mechanism that coincides with a configuration of the energy filter. In addition to directly detecting the secondary electron 205 generated on the sample 204 by the detector 206, for example, the secondary electron 205 may collide with a conversion plate (not shown), and a tertiary electron may be detected which is generated by the collision of the secondary electron 205 with the conversion plate.

Embodiment 3

Generally, an electron with which an insulator is irradiated is accumulated at a defect level and in a conduction band, but since a surface level appears on a surface of the insulator in a band gap, the electron is preferentially accumulated at a surface level. In a scanning electron microscope, a carbon-based material (contamination) may adhere to a sample surface due to electron beam irradiation, and electron mobility of the contamination is often higher than that of the insulator. Therefore, the electron accumulated in the insulator moves on the surface of the insulator rather than on a bulk thereof. Therefore, in the method described in the first embodiment, the electron accumulated on the side wall of the deep groove or hole formed in the insulator is efficiently removed, but charge removal efficiency of the electron accumulated in a flat portion is low. The third embodiment describes an apparatus and a method for performing charge removal on the electron accumulated on the surface of the insulator with high efficiency.

FIG. 8 illustrates a configuration of a scanning electron microscope according to the third embodiment. The same components as those of the scanning electron microscope illustrated in FIG. 1 are denoted by the same reference numerals, and a description thereof is omitted. In the scanning electron microscope according to the third embodiment, a counter electrode 901 is disposed between the objective lens 203 and the sample 204. The counter electrode 901 includes at least two electrodes that face each other. A different voltage is separately applied to each of the electrodes from a counter electrode power supply 902, whereby an electric field can be generated in a direction perpendicular to an optical axis of the primary electron 202. As long as a desired electric field is generated between the counter electrodes, the voltage applied to the counter electrode 901 is not particularly limited, and may be either one of a ground potential (reference potential), a positive polarity voltage, or a negative polarity voltage. A control unit 216 controls magnitude and time of the voltage applied to the counter electrode 901 by the counter electrode power supply 902.

As illustrated in FIG. 9A (cross-sectional view) and FIG. 9B (top view), an electric field is generated in the direction perpendicular to the optical axis of the primary electron 202 by the counter electrode 901, whereby an electron, which is accumulated on a surface of the sample 204 formed of a flat insulator, moves on a surface of the insulator, and removal of a negative charge is achieved. In the present embodiment, it is sufficient for the electron, which is accumulated on the surface of the sample 204, to move at least from within an observation field of view and out of the observation field of view.

In the embodiment, as shown in FIG. 10, the control unit 216 controls the counter electrode power supply 902 and the blanking power supply 211. A horizontal axis in FIG. 10 indicates time. A waveform 304 indicates that irradiation or non-irradiation with the primary electron is controlled by the blanking power supply 211; a waveform 305 indicates that a counter electrode electric field is controlled by the counter electrode power supply 902; and a waveform 306 indicates validity or invalidity of forming an image during a corresponding period. During a period $\Delta T_{ON}$, while the blanking power supply 211 is controlled such that the sample 204 is irradiated with the primary electron 202, the counter electrode electric field is not generated. In addition, during a period $\Delta T_{OFF}$, while the blanking power supply 211 is controlled such that the sample 204 is not irradiated with the primary electron 202, an electric field is generated by the counter electrode power supply 902 with the counter electrode 901. Accordingly, the electron on a surface of the flat insulator moves out of the observation field of view. During the period $\Delta T_{ON}$, an output value of the detector 206, which is obtained when the sample 204 is irradiated with the primary electron 202, is used to form the image, whereby a scanned image from which the negative charge is removed can be acquired.

A configuration in which the electric field in the direction perpendicular to the optical axis of the primary electron 202 can be generated between the objective lens 203 and the sample 204 is not limited to that illustrated in FIG. 8. For example, as illustrated in FIG. 11A (cross-sectional view) and FIG. 11B (top view), the counter electrode 901 may be disposed on a side edge portion of the sample stage 213 via an insulating wall 1401 formed of an insulating material so as to surround the sample 204. As illustrated in FIG. 11B, the counter electrode 901 includes electrodes 901c to 901e separated from each other. Accordingly, a direction where the electric field is generated can be adjusted.

Embodiment 4

The fourth embodiment is for visualizing a defect on a surface of an insulator. FIG. 12 illustrates a configuration of a scanning electron microscope used in the embodiment. The same components as those of the scanning electron microscopes illustrated in FIGS. 1, 4, and 8 are denoted by the same reference numerals, and a description thereof is omitted. The energy filter 401 and the energy filter power supply 402 are added to the scanning electron microscope according to the third embodiment. The energy filter power supply 402 is controlled by a control unit 217.

A principle of the fourth embodiment is described with reference to FIG. 13. Before a counter electrode electric field is applied, the sample 204 is set in a negative charge state as an initial charge state. It is assumed that a defect portion 1301 exists on the surface of the insulator. In the state, when the counter electrode electric field is generated between the counter electrodes 901, an electron accumulated on the surface of the insulator moves from an observation field of view, but the electron is trapped in the defect portion 1301 on the surface of the insulator, and a charge remains in the defect portion 1301. In a state where the charge only remains in the defect portion 1301, as described with reference to FIGS. 6A to 6B, a shift occurs in energy filter voltage dependency of a detected signal amount for the defect portion 1301 and other portions. Therefore, a scanned image is acquired with an energy filter voltage $V_{EF}$ in which a detected signal amount of the defect portion 1301 is larger than a detected signal amount of another location, whereby the defect portion 1301 can be visualized. A sample observation method using this principle is the same as that shown in FIG. 7B.

REFERENCE SIGN LIST 201 electron source
202 primary electron
203 objective lens
204 sample
205 secondary electron
206 detector
207 deflector
208 retarding power supply
209, 215, 216, 217 control unit
210 blanking electrode
211 blanking power supply
212 diaphragm
213 sample stage
401 energy filter
402 energy filter power supply
901 counter electrode
902 counter electrode power supply

The invention claimed is:

1. A scanning electron microscope comprising:
an electron source that emits a primary electron;
a sample stage on which a sample is placed;
a deflector that causes the sample to be scanned with the primary electron;
an objective lens that focuses the primary electron on the sample;
a primary electron control mechanism that controls irradiation of the sample with the primary electron;
an electric field control mechanism that controls an electric field between the objective lens and the sample stage;
a detector that detects a secondary electron generated by irradiating the sample with the primary electron; and
a control unit configured such that, during a first period in which the sample placed on the sample stage is irradiated with the primary electron emitted from the electron source by the primary electron control mechanism, controls such that the electric field control mechanism makes a potential applied to the sample stage have a negative polarity with respect to a potential applied to the objective lens, and during a second period in which the sample placed on the sample stage is not irradiated with the primary electron emitted from the electron source by the primary electron control mechanism, controls such that the electric field control mechanism makes the potential applied to the sample stage have a positive polarity with respect to the potential applied to the objective lens.

2. The scanning electron microscope according to claim 1, further comprising:
an energy filter that is disposed between the objective lens and the detector and selects an energy of the secondary electron detected by the detector; and
an energy filter control mechanism that controls an energy of the secondary electron selected by the energy filter, wherein
the control unit adjusts a length of the second period.

3. The scanning electron microscope according to claim 1, wherein
the primary electron control mechanism includes a blanking electrode, a diaphragm, and a first power supply that applies a voltage to the blanking electrode, and the first power supply is controlled by the control unit to control a voltage applied to the blanking electrode, a primary electron emitted from the electron source passes through the diaphragm during the first period, and a primary electron emitted from the electron source is deflected by the blanking electrode and collides with the diaphragm during the second period.

4. The scanning electron microscope according to claim 1, wherein
the electric field control mechanism is a second power supply that applies a voltage to the sample stage, and
the second power supply is controlled by the control unit such that a negative polarity voltage is applied to the sample stage with respect to the potential of the objective lens during the first period, and a positive polarity voltage is applied to the sample stage with respect to the potential of the objective lens during the second period.

5. The scanning electron microscope according to claim 1, wherein
the control unit sets either one of, a period of shifting from scanning of one line to scanning of a next line, or a period between completing scanning of one frame and starting scanning of a next frame, or a period between completing scanning of an observation field of view and moving to a next observation field of view by the deflector, as the second period.

6. A sample observation method, which includes a first period in which a sample placed on a sample stage is irradiated with a primary electron and a second period in which the sample is not irradiated with the primary electron, and uses a scanning electron microscope that includes an energy filter, the sample observation method comprising:
setting an energy of a secondary electron selected by the energy filter;
setting a length of the second period;
irradiating the sample with the primary electron under a condition that emission efficiency of the secondary electron is 1 or less;
during the second period, controlling an electric field between the sample stage and an objective lens in the second period to be in an opposite direction and at an opposite and negative polarity to an electric field between the sample stage and the objective lens in the first period; and
scanning the sample with the primary electron during the first period, and detecting the secondary electron that selectively passes through the energy filter, thus forming an image.

7. The sample observation method according to claim 6, further comprising:
during the first period, controlling a potential of the sample stage to have a negative polarity with respect to a potential applied to the objective lens, and during the second period, controlling the potential applied to the sample stage to have a positive polarity with respect to the potential applied to the objective lens.

8. The sample observation method according to claim 7, further comprising:
setting an energy of the secondary electron selected by the energy filter, based on a voltage value of the sample stage with respect to the objective lens during the first period.

9. The sample observation method according to claim 6, further comprising:
setting either one of, a period of shifting from scanning of one line to scanning of a next line, or a period between completing scanning of one frame and starting scanning of a next frame, or a period between completing scanning of an observation field of view and moving to a next observation field of view, as the second period.

10. The scanning electron microscope according to claim 2, wherein the control unit sets either one of, a period of shifting from scanning of one line to scanning of a next line, or a period between completing scanning of one frame and starting scanning of a next frame, or a period between completing scanning of an observation field of view and moving to a next observation field of view by the deflector, as the second period.

11. The scanning electron microscope according to claim 3, wherein the control unit sets either one of, a period of shifting from scanning of one line to scanning of a next line, or a period between completing scanning of one frame and starting scanning of a next frame, or a period between completing scanning of an observation field of view and moving to a next observation field of view by the deflector, as the second period.

12. The scanning electron microscope according to claim 4, wherein the control unit sets either one of, a period of shifting from scanning of one line to scanning of a next line, or a period between completing scanning of one frame and starting scanning of a next frame, or a period between completing scanning of an observation field of view and moving to a next observation field of view by the deflector, as the second period.

* * * * *